United States Patent
Folio et al.

(10) Patent No.: US 11,088,087 B2
(45) Date of Patent: Aug. 10, 2021

(54) MICRO MODULE WITH A SUPPORT STRUCTURE

(71) Applicant: STMicroelectronics, Inc., Calamba (PH)

(72) Inventors: Freddie Folio, Tanauan (PH); Michael Tabiera, Cabuyao (PH); Edwin Graycochea, Jr., Laguna (PH)

(73) Assignee: STMicroelectronics, Inc., Calamba (PH)

(*) Notice: Subject to any disclaimer, the term of this patent is extended or adjusted under 35 U.S.C. 154(b) by 55 days.

(21) Appl. No.: 16/458,559

(22) Filed: Jul. 1, 2019

(65) Prior Publication Data

US 2020/0035619 A1    Jan. 30, 2020

Related U.S. Application Data

(60) Provisional application No. 62/703,193, filed on Jul. 25, 2018.

(51) Int. Cl.
| | | |
|---|---|---|
| H01L 23/00 | (2006.01) | |
| H01L 23/498 | (2006.01) | |
| H01L 21/48 | (2006.01) | |
| G06K 19/07 | (2006.01) | |

(52) U.S. Cl.
CPC .......... H01L 23/562 (2013.01); G06K 19/07 (2013.01); H01L 21/4853 (2013.01); H01L 23/49838 (2013.01); H01L 23/49855 (2013.01); H01L 24/48 (2013.01); *H01L 2224/48157* (2013.01); *H01L 2924/3512* (2013.01)

(58) Field of Classification Search
None
See application file for complete search history.

(56) References Cited

U.S. PATENT DOCUMENTS

| | | | | |
|---|---|---|---|---|
| 5,729,437 A | * | 3/1998 | Hashimoto | ......... H01L 23/3121 174/260 |
| 6,028,774 A | * | 2/2000 | Shin | ................. G06K 19/07745 257/679 |
| 6,492,717 B1 | * | 12/2002 | Gore | ................. G06K 19/07745 257/678 |
| 7,387,259 B2 | * | 6/2008 | Thevenot | ............. G06K 19/072 235/492 |
| 8,669,140 B1 | * | 3/2014 | Muniandy | ............. H01L 25/105 438/109 |
| 9,449,912 B1 | * | 9/2016 | Zhang | ............... H01L 23/49855 |
| 10,438,895 B1 | * | 10/2019 | Hackler, Sr. | ............ H01L 23/13 |

(Continued)

FOREIGN PATENT DOCUMENTS

EP    2631849 A1 *    8/2013    ....... G06K 19/07745

*Primary Examiner* — Andres Munoz
(74) *Attorney, Agent, or Firm* — Seed IP Law Group LLP

(57) ABSTRACT

The present disclosure is directed to a micro module with a support structure. The micro module includes a carrier substrate having contacts and a bonding pad, a semiconductor die, and a support structure. The semiconductor die is positioned on the bonding pad and is electrically coupled to the contacts. The support structure is positioned on the bonding pad and adjacent to the semiconductor die. The support structure reinforces the bonding pad such that the bonding pad is more rigid than flexible. As a result, an external force applied to the micro module is less likely to cause the micro module to bend and damage the semiconductor die.

23 Claims, 3 Drawing Sheets

(56) References Cited

U.S. PATENT DOCUMENTS

| | | | |
|---|---|---|---|
| 2003/0179556 A1* | 9/2003 | Zhao | H01L 23/3128 |
| | | | 361/760 |
| 2008/0224330 A1* | 9/2008 | Chang | H01L 23/5286 |
| | | | 257/784 |
| 2014/0061895 A1* | 3/2014 | Foong | H01L 25/065 |
| | | | 257/723 |
| 2014/0224882 A1* | 8/2014 | Hackler, Sr. | G06K 19/0779 |
| | | | 235/488 |
| 2014/0307405 A1* | 10/2014 | Vogt | H05K 1/113 |
| | | | 361/767 |
| 2015/0093858 A1* | 4/2015 | Hwang | H01L 24/19 |
| | | | 438/113 |
| 2015/0269472 A1* | 9/2015 | Finn | G06K 19/07794 |
| | | | 235/492 |
| 2017/0140257 A1* | 5/2017 | Zenz | H01L 24/48 |
| 2017/0270398 A1* | 9/2017 | Mathieu | G06K 19/07733 |
| 2018/0151461 A1* | 5/2018 | Cho | H01L 23/562 |
| 2019/0294943 A1* | 9/2019 | Ng | G06K 19/07754 |

\* cited by examiner

MICRO MODULE WITH A SUPPORT STRUCTURE

BACKGROUND

Technical Field

The present disclosure is directed to a micro module, such as a subscriber identity module (SIM).

Description of the Related Art

Subscriber identity modules (SIM) are used for a variety of applications, such as providing user information for security products and mobile devices. SIMs generally include a semiconductor die, and a plurality of contacts electrically coupled to the semiconductor die.

SIMs that are typically embedded or housed in a card body, and are often referred to as integrated circuit cards or SIM cards. When embedded in a card body, signals of a semiconductor die of the SIM are brought to the surface of the card body through the contacts. For example, when the integrated circuit card is inserted in to a card reader in a host device (e.g., a computer, a security device, a mobile telephone, etc.), the contacts will physically touch card contacts of the card reader and, thus, electrically couple the semiconductor die of the SIM to the host device.

As the card bodies in which SIMs are embedded in are thin, the SIMs themselves are very thin and tend to be more flexible than rigid. Consequently, SIMs are generally fragile and susceptible to being damaged. For example, due to the flexibility of the SIMs, a SIM may unintentionally bend when an external force is applied to the SIM during transport, and the mechanical stress may cause the semiconductor die of the SIM to crack. Similarly, when a SIM card is repeatedly inserted in to a card reader, the semiconductor die of a SIM may crack from the pressure applied by the card contacts of the card reader.

BRIEF SUMMARY

The present disclosure is directed to a micro module with a support structure that increases the overall strength of the micro module and prevents a semiconductor die within the micro module from cracking.

The micro module includes a carrier substrate having contacts and a bonding pad, a semiconductor die, and a support structure. The semiconductor die is positioned on the bonding pad and is electrically coupled to the contacts. The semiconductor die may be any type of integrated circuit and may include any number of electronic components (e.g., memory, processor, capacitors, transistors, resistors etc.). The support structure is positioned on the bonding pad and adjacent to the semiconductor die. The support structure provides additional support for the micro module and stress relief for any pressure applied to the micro module. Stated differently, the support structure reinforces the bonding pad such that the bonding pad is more rigid than flexible. As a result, an external force applied to the micro module is less likely to cause the micro module to bend and possibly cause damage to the semiconductor die.

BRIEF DESCRIPTION OF THE SEVERAL VIEWS OF THE DRAWINGS

In the drawings, identical reference numbers identify similar features or elements. The size and relative positions of features in the drawings are not necessarily drawn to scale.

DETAILED DESCRIPTION

In the following description, certain specific details are set forth in order to provide a thorough understanding of various aspects of the disclosed subject matter. However, the disclosed subject matter may be practiced without these specific details. In some instances, well-known structures and methods of manufacturing of electronic devices, subscriber identity modules (SIM), and integrated circuit cards have not been described in detail to avoid obscuring the descriptions of other aspects of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting or glass substrates, whether or not the components are coupled together into a circuit or able to be interconnected. Throughout the specification, the term "layer" is used in its broadest sense to include a thin film, a cap, or the like, and one layer may be composed of multiple sub-layers.

The present disclosure is directed to a micro module, such as a SIM, that includes a support structure.

Figure 1:
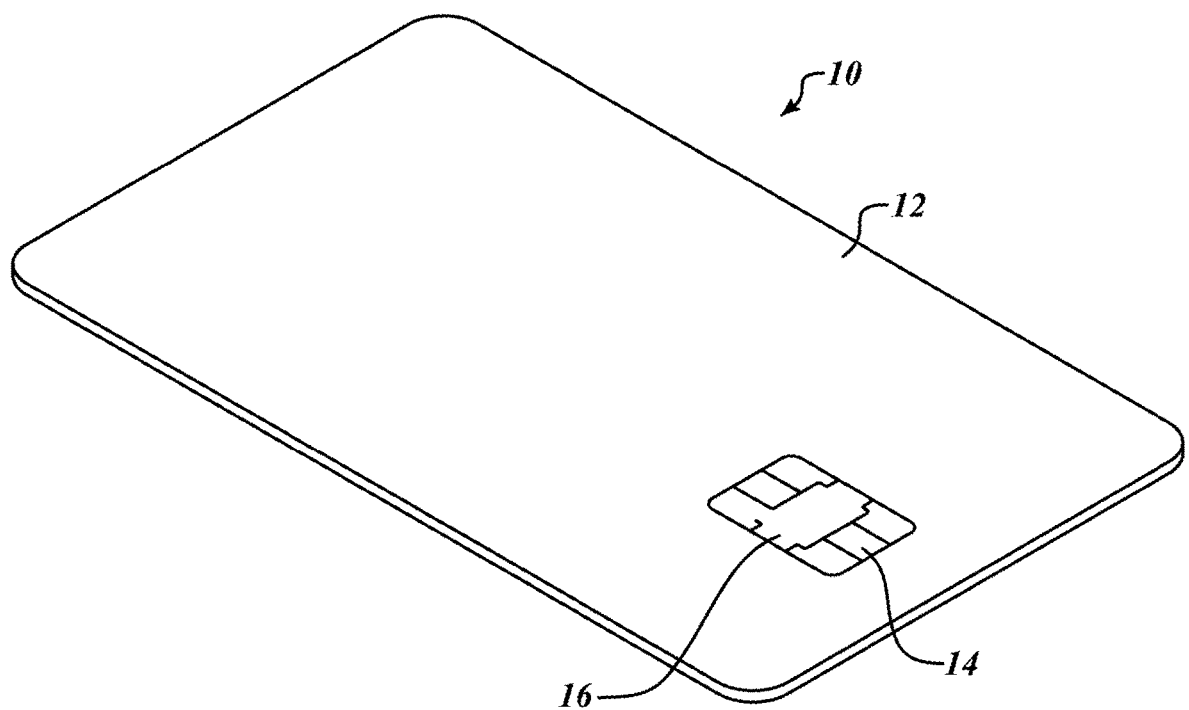
FIG. 1 is a card according to an embodiment of the present disclosure.

FIG. 1 is a card 10 according to an embodiment of the present disclosure. The card 10 is an integrated circuit card that houses a micro module. The card 10 includes a card body 12 and a micro module 14.

The card body 12 houses the micro module 14. In one embodiment, the card body 12 is made of an insulating material, such as plastic. In one embodiment, as shown in FIG. 1, the card body 12 has the size and shape of a credit card. However, it is noted that the card body 12 may have a variety of different sizes and shapes. For example, the card body 12 may have the size and shape of full SIM, micro SIM, a nano SIM, etc.

The micro module 14 is embedded in the card body 12. The micro module 14 is an electronic device that provides the functionality of the card 10. In one embodiment, the micro module 14 is a SIM. In one embodiment, the micro module 14 is used to provide identification and/or authentication information for security purposes. As will be discussed in further detail below, the micro module 14 includes a silicon die and a plurality of contacts electrically coupled to the silicon die.

As shown in FIG. 1, a contact side 16 of the micro module 14 is left exposed from the card body 12. As such, when the card body 12 is inserted in to a card reader of a host device (e.g., a computer, a security device, a mobile telephone, etc.), card contacts of the card reader can physically touch the contacts of the micro module 14 and, thus, electrically couple a semiconductor die of the micro module 14 to the host device. As a result, signals may be transmitted between the semiconductor die of the micro module 14 and the host device.

Figure 2:
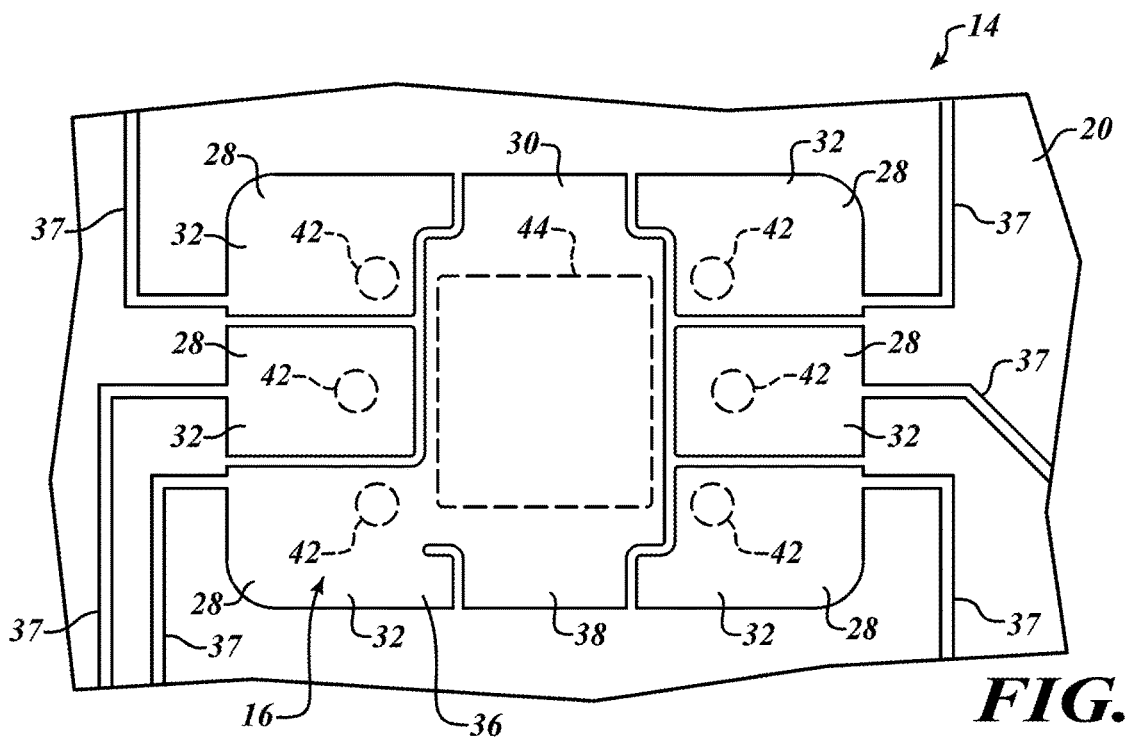
FIG. 2 is an enlarged view of a contact side of a micro module according to an embodiment of the present disclosure.
Figure 3:
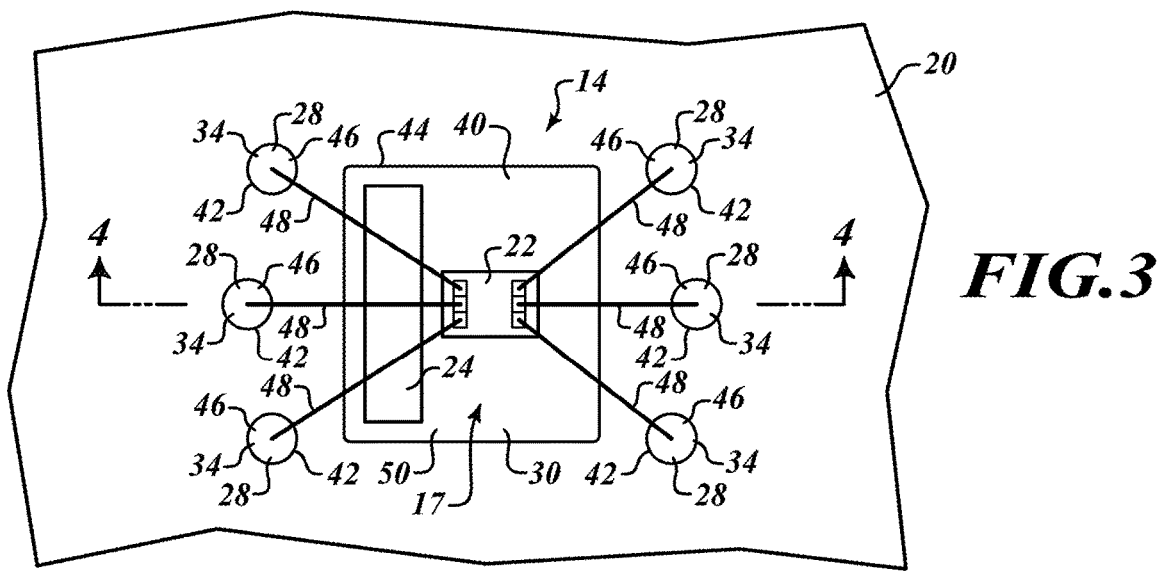
FIG. 3 is an enlarged view of a bonding side of a micro module according to an embodiment of the present disclosure.
Figure 4:
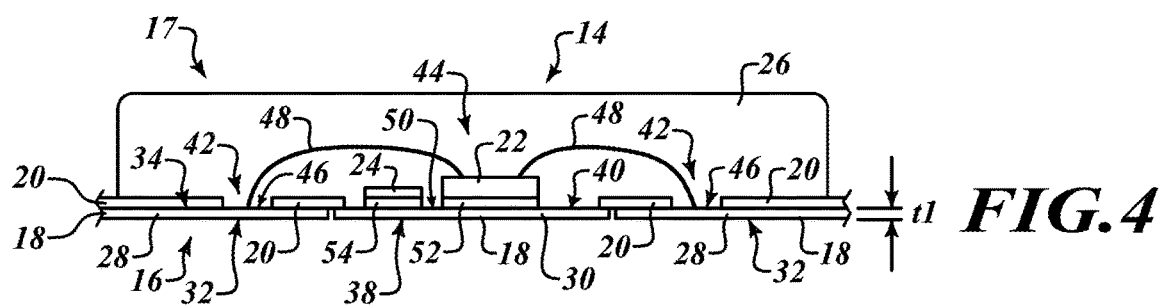
FIG. 4 is a cross-sectional view of a micro module along the axis shown in FIG. 3 according to an embodiment of the present disclosure.

FIG. 2 is an enlarged view of the contact side 16 of the micro module 14 according to an embodiment of the present disclosure. FIG. 3 is an enlarged view of a bonding side 17, opposite to the contact side 16, of the micro module 14 according to an embodiment of the present disclosure. FIG. 4 is a cross-sectional view of the micro module 14 along the axis shown in FIG. 3, according to an embodiment of the present disclosure. It is noted that the card body 12 is removed in FIGS. 2 to 4. It is beneficial to review FIGS. 2 to 4 together.

The micro module 14 includes a carrier substrate 18, an insulating layer 20, a semiconductor die 22, a support structure 24, and a protective layer 26.

The carrier substrate 18 supports the semiconductor die 22 and the support structure 24, and provides electrical connections between the semiconductor die 22 and an external electronic device, such as a computer and a mobile device. The carrier substrate 18 includes contacts 28 and a bonding pad 30.

The contacts 28 provide contact pads for the micro module 14. Each of the contacts 28 includes a first surface 32 on the contact side 16, and a second surface 34 that is opposite to the first surface 32 and on the bonding side 17. As best shown in FIG. 1, the first surface 32 of the contacts 28 are exposed from the card body 12 when the micro module 14 is embedded in the card body 12. Accordingly, card contacts of a card reader are able to physically touch the first surface 32 when the card body 12 is inserted in to a card reader of a host device. As will be discussed in further detail below, the second surface 34 of the contacts 28 receives a wire to electrically couple the contacts 28 and the semiconductor die 22 together. It is noted that, although six contacts 28 are shown in FIG. 2, the micro module 14 may include any number of contacts.

In one embodiment, the contacts 28 are electrically isolated from each other such that the contacts 28 may carry respective signals. In one embodiment, at least one of the contacts 28 is coupled to the bonding pad 30. For example, as best shown in FIG. 2, a contact 36 is electrically coupled to the bonding pad 30. In one embodiment, the contact 36 is used as a ground.

In one embodiment, the contacts 28 are electrically coupled to other various electronic components (e.g., memory, processor, capacitors, transistors, resistors etc.) within the micro module 14 or external to the micro module 14. For example, as best shown in FIG. 2, the contacts 28 may be electrically coupled to the various electronic components via electrical connections 37 on the insulating layer 20.

The bonding pad 30 provides a support for the semiconductor die 22 and the support structure 24. The bonding pad 30 includes a first surface 38 on the contact side 16, and a second surface 40 that is opposite to the first surface 38 and on the bonding side 17. As best shown in FIG. 1, the first surface 38 of the bonding pad 30 is exposed from the card body 12 when the micro module 14 is embedded in the card body 12. As will be discussed in further detail below, the second surface 40 receives the semiconductor die 22 and the support structure 24.

In one embodiment, as shown in FIG. 4, the bonding pad 30 is substantially coplanar with the contacts 28.

As previously discussed, in one embodiment, the bonding pad 30 is electrically isolated from one or more of the contacts 28. In one embodiment, at least one of the contacts 28 (e.g., contact 36) is coupled to the bonding pad 30.

In one embodiment, the carrier substrate 18, including the contacts 28 and the bonding pad 30, is made of a conductive material. In one embodiment, the contacts 28 and the bonding pad 30 are made of the same material. In one embodiment, the contacts 28 and the bonding pad 30 are made of different materials.

In one embodiment, the carrier substrate 18, including the contacts 28 and the bonding pad 30, has a small thickness in order for the micro module 14 to be embedded in to the card body 12. In one embodiment, the carrier substrate 18 has a thickness t1 that is less than 50 micrometers. In one embodiment, the carrier substrate 18 has a thickness t1 between 25 to 35 micrometers.

The insulating layer 20 is on the carrier substrate 18. The insulating layer 20 provides a substrate for the carrier substrate 18, including the contacts 28 and the bonding pad 30. In addition, as best shown in FIG. 2, the insulating layer 20 provides a substrate for any electrical connections 37 coupled to the contacts 28. As previously discussed, in one embodiment, the contacts 28 are electrically coupled to other various electronic components (e.g., processor, capacitors, transistors, resistors etc.) within the micro module 14 or external to the micro module 14. The insulating layer 20 may be made of any type of insulating material. In one embodiment, the insulating layer 20 is carrier tape. In one embodiment, the insulating layer 20 is a single, contiguous layer.

The insulating layer 20 includes a plurality of openings on the bonding side 17 of the micro module 14. In particular, as best shown in FIGS. 3 and 4, the insulating layer 20 includes contact openings 42 that directly overlie and expose the second surface 34 of the contacts 28, and a bonding pad opening 44 that directly overlies and exposes the second surface 40 of the bonding pad 30. The positions of the contact openings 42 and the bonding pad opening 44 relative to the contact side 16 of the micro module 14 are shown as dotted outlines in FIG. 2.

The portions of the second surface 34 of the contacts 28 that are exposed by the contact openings 42 are used as wire bonding areas 46. As will be discussed in further detail below, each of the wire bonding areas 46 receives an end of a wire 48 that electrically couples the semiconductor die 22 to the contacts 28.

The insulting layer 20 may include any number of contact openings 42. For example, the insulating layer 20 may include 2, 3, or 4 contact openings that directly overlie respective contacts. In one embodiment, the insulating layer 20 includes a respective contact opening for each of the contacts 28. For example, as best shown in FIG. 3, the insulting layer 20 includes six openings for the six contacts 28.

The contact openings 42 may have any shape and size. In one embodiment, as best shown in FIG. 3, each of the contact openings 42 has a circular shape. In one embodiment, the contact openings 42 are sized to accommodate at least an end of a wire 48.

The portion of the second surface 40 of the bonding pad 30 that is exposed by the bonding pad opening 44 is used as a die bonding area 50. The die bonding area 50 is sometimes referred to as a cavity bonding area. As will be discussed in further detail below, the die bonding area 50 receives the semiconductor die 22 and the support structure 24.

The bonding pad opening 44 may have any shape and size. In one embodiment, as best shown in FIG. 3, the bonding pad opening 44 has a rectangular shape. In one embodiment, the bonding pad opening is sized to accommodate at least the semiconductor die 22 and the support structure 24.

The semiconductor die 22 is coupled to the bonding pad 30. In particular, the semiconductor die 22 is coupled to the second surface 40 of the bonding pad 30 in the die bonding area 50. In one embodiment, the semiconductor die 22 is directly attached to the second surface 40 of the bonding pad 30 in the die bonding area 50. For example, as shown in FIG. 4, the semiconductor die 22 is attached to the second surface 40 of the bonding pad 30 with an adhesive 52. The adhesive 52 may be any type of adhesive, such as die attach epoxy.

The semiconductor die 22 is electrically coupled to the contacts 28. In one embodiment, as best shown in FIGS. 3 and 4, the semiconductor die 22 is electrically coupled to the contacts 28 via wires 48. Namely, each of the wires has a first end coupled to the semiconductor die 22 and a second end coupled to the wire bonding areas 46 of a respective contact 28. As previously discussed, as best shown in FIG. 1, the first surface 32 of the contacts 28 is exposed from the card body 12 when the micro module 14 is embedded in the card body 12. Accordingly, when the card body 12 is inserted in to a card reader in a host device, card contacts of the card reader can physically touch the contacts of the micro module 14 and, thus, electrically couple the semiconductor die 22 to the host device. As a result, signals may be transmitted between the semiconductor die 22 and the host device.

The semiconductor die 22 may be any type of integrated circuit and may include any number of electronic components (e.g., memory, processor, capacitors, transistors, resistors etc.). In one embodiment, the semiconductor die 22 provides identification and/or authentication information for security purposes.

The support structure 24 is coupled to the bonding pad 30 and adjacent to the semiconductor die 22. In particular, the support structure 24 is coupled to the second surface 40 of the bonding pad 30 in the die bonding area 50. In one embodiment, the support structure 24 is directly attached to the second surface 40 of the bonding pad 30 in the die bonding area 50. For example, as shown in FIG. 4, the support structure 24 is attached to the second surface 40 of the bonding pad 30 with the adhesive 54. The adhesive 54 may be any type of adhesive, such as die attach epoxy.

As previously discussed, in one embodiment, the carrier substrate 18 has a small thickness (e.g., less than 50 micrometers thick). Due to the thinness of the carrier substrate 18, the carrier substrate 18, in particular the bonding pad 30, tends to be more flexible than rigid. Consequently, the semiconductor die 22 is susceptible to being damaged during transport or during normal use. For example, an external force unintentionally applied to the micro module 14 during transport may cause the carrier substrate 18 to bend and the semiconductor die 22 to crack. Similarly, the carrier substrate 18 may be bent and the semiconductor die 22 may crack due to pressure being applied to the contacts 28 by card contacts of a card reader when the card 10 is repeatedly inserted in to the card reader. The flexibility of the carrier substrate 18 is further exacerbated when the semiconductor die 22, itself, is thin and/or relatively small. For example, the carrier substrate 18 is particularly susceptible to being bent when the semiconductor die 22 is less than 150 micrometers thick, and/or when the semiconductor die 22 covers a relatively small portion (e.g., less than 50 percent) of the surface area of the second surface 40 of the bonding pad 30.

In order to prevent such damage to the semiconductor die 22, the support structure 24 is made of a rigid material and is positioned adjacent to the semiconductor die 22. In one embodiment, the support structure 24 is more rigid than the carrier substrate 18, specifically the bonding pad 30 and/or the contacts 28. That is, the support structure 24 is able withstand a larger amount of pressure or force before cracking than the carrier substrate 18. In one embodiment, the support structure 24 is positioned near or at a center of the bonding pad 30 as the center of the bonding pad 30 is the most susceptible to being bent.

The support structure 24 provides additional support for the micro module 14 and a stress relief for any pressure applied to the micro module 14. Stated differently, the support structure 24 reinforces the bonding pad 30 to increase the stiffness of the bonding pad 30. As a result, an external force applied to the micro module 14 is less likely to cause the micro module 14 to bend and damage the semiconductor die 22. In one embodiment, the support structure 24 provides additional support for the micro module 14 such that the micro module 14 is able to withstand at least 6 newtons of pressure without being damaged (e.g., a crack being formed in the semiconductor die 22 or the protective layer 26).

Accordingly, the support structure 24 increases the robustness and reliability of the micro module 14.

In one embodiment, the support structure 24 is made of a material having high thermomechanical strength. Namely, the support structure 24 is made of a material that is able to maintain its rigidity and strength even when exposed to extreme temperatures (e.g., temperatures greater than a recommended curing profile of 160 degrees Celsius). For example, in one embodiment, the support structure 24 is made of a material with a melting point temperature of 1400 degrees Celsius. In one embodiment, the support structure 24 is a glass substrate. In one embodiment, the support structure 24 is a mirror silicon die.

In one embodiment, the support structure 24 has a maximum height equal to the height of the semiconductor die 22. Stated differently, in one embodiment, the support structure 24 has a height or thickness such that an upper surface of the support structure 24 does not extend past and above an upper surface of the semiconductor die 22. For example, as best shown in FIG. 4, the support structure 24 has a thickness (in the vertical direction) that is smaller than the thickness of the semiconductor die 22 such that the top surface of the support structure 24 is positioned below the top surface of the semiconductor 22. As a result, the support structure 24 will not unnecessarily increase the overall thickness of the micro module 14.

In one embodiment, the support structure 24 covers a substantial portion of the surface area of the second surface 40 of the bonding pad 30 to increase the strength of the micro module 14. For example, in one embodiment, the support structure 24 covers between than 30-50 percent of the second surface 40 of the bonding pad 30.

The support structure 24 may be any shape. In one embodiment, as best shown in FIG. 3, the support structure 24 has a rectangular shape. In one embodiment, the support structure 24 has an annular shape, and the semiconductor die 22 is positioned in the center of the support structure 24.

It is noted that, although a single support structure is shown in FIGS. 3 and 4, the micro module 14 may include a plurality of support structures to further increase the strength of the micro module 14. For example, in one embodiment, the micro module 14 includes two support structures with the semiconductor die 22 positioned between the two support structures.

The protective layer 26 is formed on the carrier substrate 18, the insulating layer 20, the semiconductor die 22, the support structure 24, and the wires 48. It is noted that the protective layer 26 is not shown in FIG. 3. The protective layer 26 is formed on the bonding side 17 and protects the carrier substrate 18, the insulating layer 20, the semiconductor die 22, the support structure 24, and the wires 48 from damage. In one embodiment, the protective layer 26 is made of a resin material.

Figure 5:
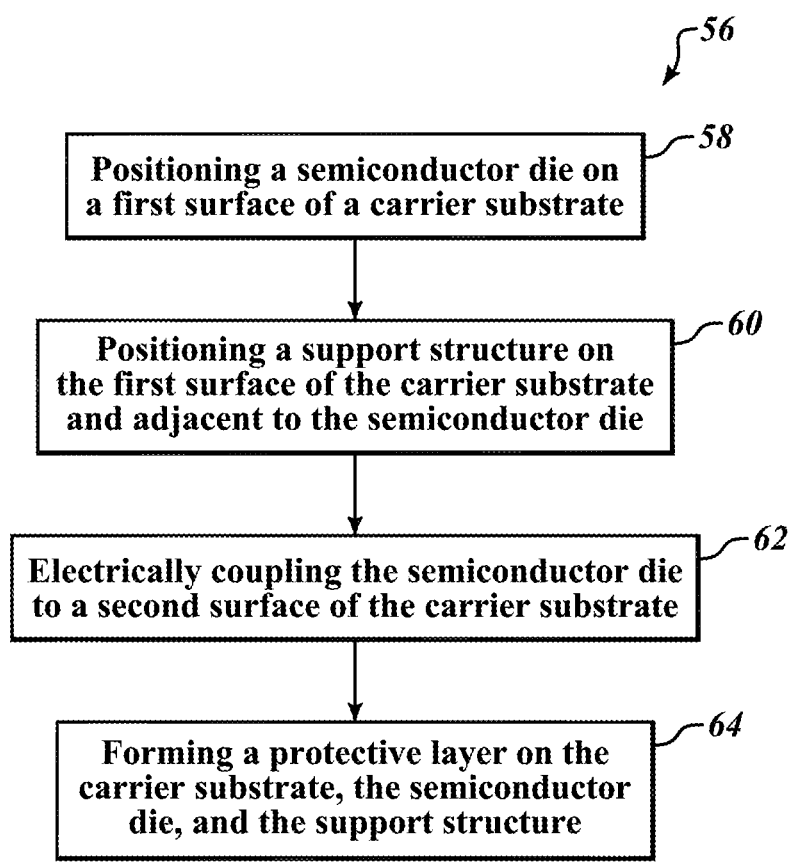
FIG. 5 is a flow diagram of a method of fabricating a micro module according to an embodiment of the present disclosure.

FIG. 5 is a flow diagram of a method 56 of fabricating the micro module 14 according to an embodiment of the present disclosure.

In block 58, a semiconductor die is positioned on a first surface of a carrier substrate. For example, referring to FIGS. 2 to 4, the semiconductor die 22 is positioned on the second surface 40 of the bonding pad 30 in the die bonding area 50 of the carrier substrate 18.

In block 60, a support structure is positioned on the first surface of the carrier substrate and adjacent to the semiconductor die. For example, referring to FIGS. 2 to 4, the support structure 24 is coupled to the second surface 40 of the bonding pad 30 in the die bonding area 50 of the carrier substrate 18. In one embodiment, the support structure 24 is positioned on the carrier substrate 18 when the carrier substrate 18 has a thickness less than 50 micrometers thick and the semiconductor die 22 covers less than 50 percent of the surface area of the second surface 40 of the bonding pad 30.

In block 62, the semiconductor die is electrically coupled to a second surface of the carrier substrate. For example, referring to FIGS. 2 to 4, the semiconductor die 22 is electrically coupled to the contacts 28 via the wires 48, which extend between the semiconductor die 22 and the wire bonding areas 46.

In block 64, a protective layer is formed on the carrier substrate, the semiconductor die, and the support structure. For example, referring to FIGS. 2 to 4, the protective layer 26 is formed on the carrier substrate 18, the insulating layer 20, the semiconductor die 22, the support structure 24, and the wires 48.

It is noted that, although blocks 58, 60, 62, and 64 are positioned in subsequent order in FIG. 5, the blocks 58, 60, 62, and 64 may be performed in another orders as well. For example, block 60 may be performed prior to block 58, blocks 58 and 60 may be performed concurrently, and block 58 may be performed subsequent to block 62.

Although the support structure 24 is discussed above with respect a micro module, such as a SIM, the support structure may be included in a variety of devices in which reinforcement of the device is desirable.

The various embodiments provide a micro module with a support structure that increases the overall strength of the micro module. As a result, the micro module is less susceptible to package splintering and package reliability is improved.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a bonding pad;
a plurality of contacts;
an insulating layer on the bonding pad and the plurality of contacts, the insulating layer including a first opening that exposes a surface of the bonding pad, and a plurality of second openings that expose surfaces of the plurality of contacts;
a semiconductor die on the surface of the bonding pad, the semiconductor die covering less than 50 percent of the surface of the bonding pad;
a support structure on the surface of the bonding pad; and
a plurality of wires electrically coupling the semiconductor die to the plurality of contacts, the plurality of wires extending from the semiconductor die to the surfaces of the plurality of contacts.

2. The device of claim 1 wherein the support structure is more rigid than the bonding pad.

3. The device of claim 1 wherein the insulating layer is a carrier tape.

4. The device of claim 1 wherein the support structure is made of glass.

5. The device of claim 1 wherein at least one of the plurality of contacts is electrically coupled to the bonding pad.

6. The device of claim 1 wherein the bonding pad and the plurality of contacts are electrically isolated from each other.

7. The device of claim 1 wherein the insulating layer is a single, contiguous layer.

8. The device of claim 1 wherein the bonding pad is less than 50 micrometers thick.

9. The device of claim 1, further comprising:
a card body, the semiconductor die, the support structure, and the plurality of wires being embedded in the card body.

10. The device of claim 1, further comprising:
a protective layer on the insulating layer, a portion of the protective layer being in the first opening and on the surface of the bonding pad, portions of the protective layer being in the plurality of second openings and on the surfaces of the plurality of contacts.

11. A method, comprising:
positioning a semiconductor die on a surface of a bonding pad, the surface of the bonding pad being exposed by a first opening in an insulating layer;
positioning a support structure on the surface of the bonding pad, the semiconductor die and the support structure being positioned in the first opening; and
electrically coupling the semiconductor die to a plurality of contacts via a plurality of wires, the plurality of wires extending from the semiconductor die to surfaces of the plurality of contacts, the surfaces of the plurality of contacts being exposed by a plurality of second openings in the insulating layer, the bonding pad and the plurality of contacts being substantially coplanar.

12. The method of claim 11 wherein the support structure is more rigid than the bonding pad.

13. The method of claim 12 wherein the insulating layer is a carrier tape.

14. The method of claim 11 wherein the support structure is made of glass.

15. The method of claim 11 wherein the bonding pad has a thickness that is less than 50 micrometers, and the semiconductor die covers less than 50 percent of the surface of the bonding pad.

16. A device, comprising:
- a carrier substrate including a bonding pad and a plurality of contacts;
- an insulating layer on the carrier substrate, the insulating layer including an opening that exposes the bonding pad;
- a semiconductor die on the bonding pad and in the opening;
- a support substrate on the bonding pad and in the opening, the semiconductor die and the support substrate being directly attached to the bonding pad; and
- a plurality of wires electrically coupling the semiconductor die to the plurality of contacts.

17. The device of claim 16 wherein the plurality of contacts includes a first set of contacts and a second set of contacts, and the bonding pad is positioned between the first and second sets of contacts.

18. The device of claim 16 wherein the bonding pad and the plurality of contacts are substantially coplanar.

19. The device of claim 16 wherein the support substrate is a glass substrate.

20. The device of claim 16 wherein the semiconductor die and the support substrate are directly attached to the bonding pad with adhesive.

21. A device, comprising:
- a carrier substrate including a bonding pad and a plurality of contacts, the bonding pad and the plurality of contacts being substantially coplanar;
- an insulating layer on the carrier substrate, the insulating layer including an opening that exposes the bonding pad;
- a semiconductor die on the bonding pad and in the opening;
- a support substrate on the bonding pad and in the opening; and
- a plurality of wires electrically coupling the semiconductor die to the plurality of contacts.

22. The device of claim 21 wherein the semiconductor die and the support substrate are directly attached to the bonding pad with adhesive.

23. The device of claim 21 wherein the support substrate is a glass substrate.

* * * * *